United States Patent
Lee et al.

(10) Patent No.: US 8,847,231 B2
(45) Date of Patent: Sep. 30, 2014

(54) ORGANIC LIGHT EMITTING DISPLAY DEVICE AND MANUFACTURING METHOD FOR THE SAME

(71) Applicant: Samsung Display Co., Ltd., Yongin (KR)

(72) Inventors: June-Woo Lee, Yongin (KR); Chun-Gi You, Yongin (KR); Joon-Hoo Choi, Yongin (KR)

(73) Assignee: Samsung Display Co., Ltd., Giheung-Gu, Yongin, Gyeonggi-Do (KR)

( * ) Notice: Subject to any disclaimer, the term of this patent is extended or adjusted under 35 U.S.C. 154(b) by 0 days.

(21) Appl. No.: 14/093,333

(22) Filed: Nov. 29, 2013

(65) Prior Publication Data

US 2014/0141557 A1  May 22, 2014

Related U.S. Application Data

(62) Division of application No. 13/229,878, filed on Sep. 12, 2011, now Pat. No. 8,624,249.

(30) Foreign Application Priority Data

Dec. 8, 2010 (KR) .................. 10-2010-0124863

(51) Int. Cl.
| | |
|---|---|
| H01L 29/04 | (2006.01) |
| H01L 27/14 | (2006.01) |
| H01L 29/18 | (2006.01) |
| H01L 21/00 | (2006.01) |
| H01L 51/56 | (2006.01) |

(52) U.S. Cl.
CPC .............. *H01L 51/56* (2013.01); *H01L 21/00* (2013.01); *H01L 29/18* (2013.01); *H01L 27/14* (2013.01)
USPC .................... 257/59; 257/72; 257/88; 438/29

(58) Field of Classification Search
CPC ............ H01L 27/3248; H01L 27/3276; H01L 2227/323
USPC ................... 257/59, 72, 88; 438/29, 69, 82
See application file for complete search history.

(56) References Cited

U.S. PATENT DOCUMENTS

| | | |
|---|---|---|
| 7,838,880 B2 | 11/2010 | Kwak et al. |
| 2007/0278497 A1 | 12/2007 | Kawakami et al. |
| 2007/0295963 A1 | 12/2007 | Yano et al. |
| 2008/0111484 A1 | 5/2008 | Kwon et al. |
| 2008/0224600 A1 | 9/2008 | Im et al. |
| 2008/0225190 A1 | 9/2008 | Chen et al. |
| 2008/0230767 A1 | 9/2008 | Jung et al. |
| 2008/0296565 A1 | 12/2008 | Park et al. |
| 2010/0193790 A1 | 8/2010 | Yeo et al. |

FOREIGN PATENT DOCUMENTS

| | | |
|---|---|---|
| KR | 10-2007-0115699 | 12/2007 |
| KR | 10-2007-0121594 | 12/2007 |
| KR | 10-0787461 | 12/2007 |
| KR | 10-2009-0082685 | 7/2009 |
| KR | 10-2009-0120698 | 11/2009 |

*Primary Examiner* — Long K Tran
*Assistant Examiner* — Dzung Tran
(74) *Attorney, Agent, or Firm* — Robert E. Bushnell, Esq.

(57) ABSTRACT

An organic light emitting display device includes a substrate, a thin film transistor formed on the substrate and including an active layer, a gate electrode including a gate lower electrode and a gate upper electrode, a source electrode, and a drain electrode, an organic light emitting device electrically connected to the thin film transistor, wherein a pixel electrode formed of the same material as at least a part of the gate electrode in the same layer, an intermediate layer including a light emitting layer, and an opposed electrode arranged to face the pixel electrode are sequentially deposited.

12 Claims, 9 Drawing Sheets

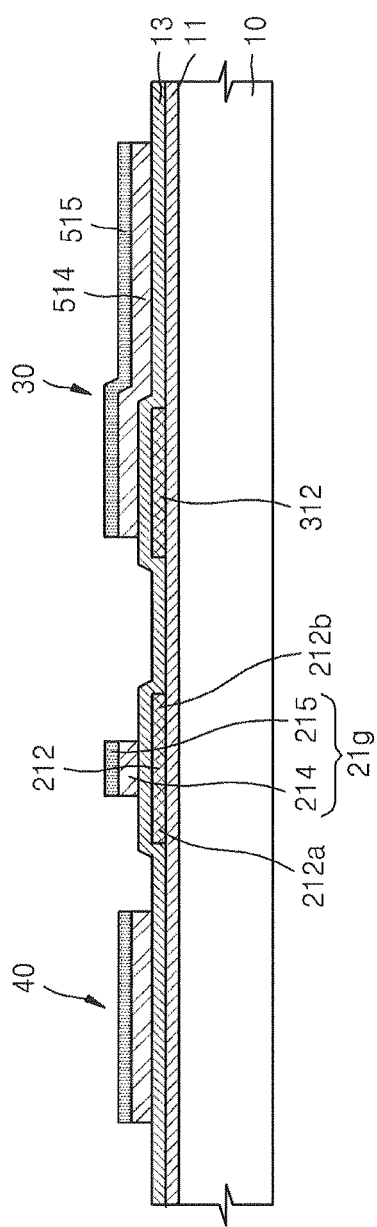
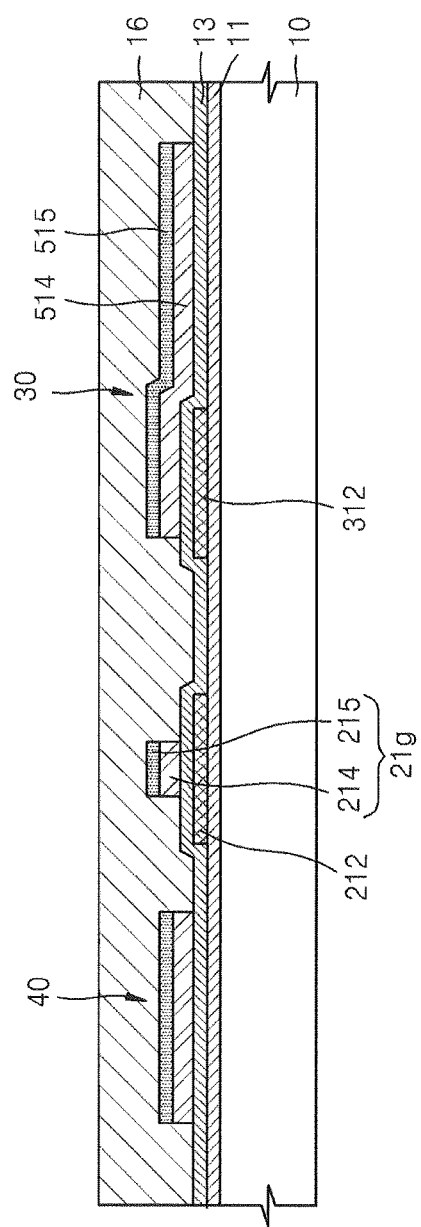

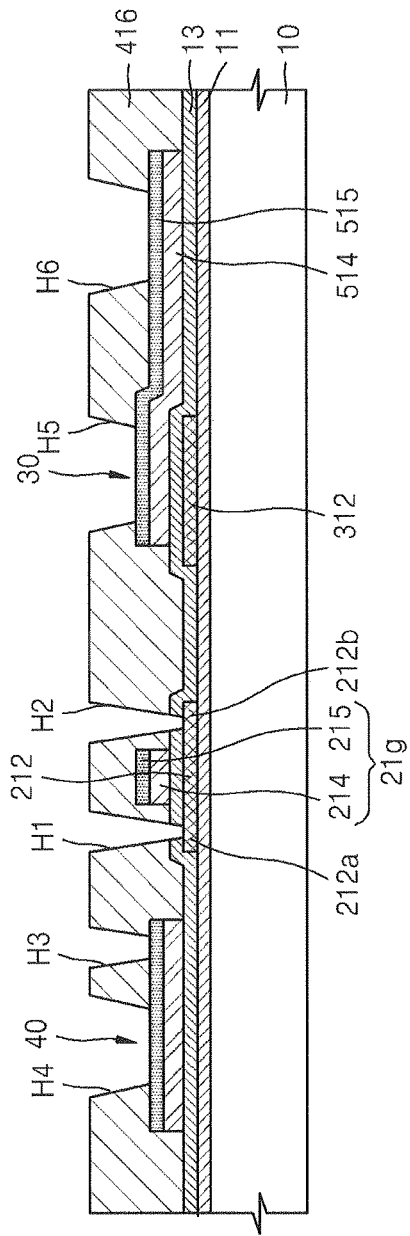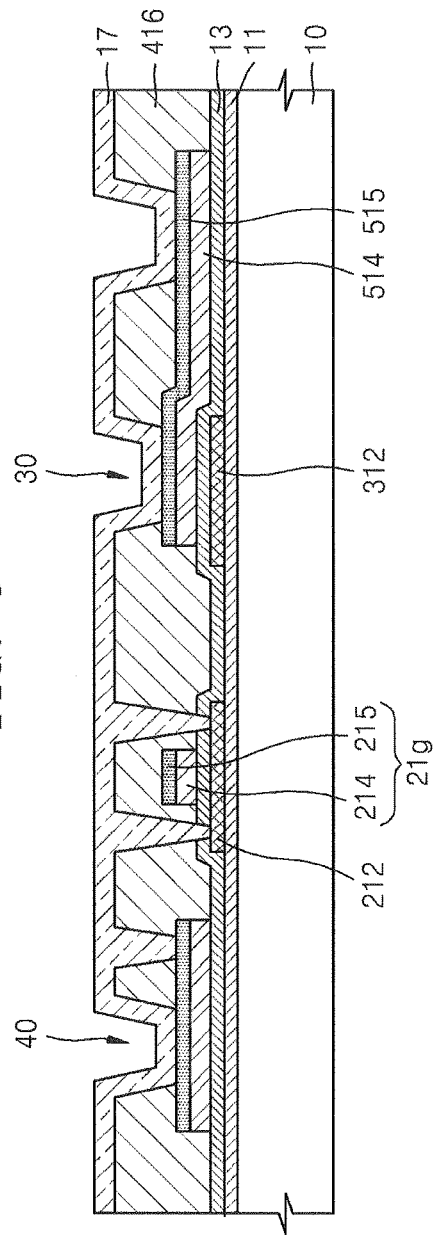

ORGANIC LIGHT EMITTING DISPLAY DEVICE AND MANUFACTURING METHOD FOR THE SAME

CROSS-REFERENCE TO RELATED APPLICATIONS AND CLAIM OF PRIORITY

This application is a divisional application of the prior application Ser. No. 13/229,878 filed in the U.S. Patent & Trademark Office on 12 Sep. 2011 and assigned to the assignee of the present invention. Furthermore, this application makes reference to, incorporates the same herein, and claims all benefits accruing under 35 U.S.C. §119 from an application earlier filed in the Korean Intellectual Property Office on 8 Dec. 2010 and there duly assigned Serial No. 10-2010-0124863.

BACKGROUND OF THE INVENTION

1. Field of the Invention

The present invention relates to an organic light emitting display device and a manufacturing method thereof, and more particularly, to an organic light emitting display device having a simplified manufacturing process and satisfying all of a patterning characteristic, an electrical characteristic, and a pad reliability of a pad unit, and a method of manufacturing the organic light emitting display device.

2. Description of the Related Art

Flat panel display devices such as organic light emitting display devices or liquid crystal display devices are manufactured on a substrate on which a pattern including thin film transistors (TFTs), capacitors, and wiring connecting the TFTs and capacitors is formed. In general, to form a fine pattern including TFTs on a substrate on which a flat panel display device is manufactured, the pattern is transferred to the substrate by using a mask where the fine pattern is formed.

A process to transfer a pattern using a mask generally uses a photolithography process. According to the photolithography process including a series of sub-steps, photoresist is uniformly formed on a substrate on which a pattern is to be formed. The photoresist is exposed to light using an exposure equipment such as a stepper. In the case of positive photoresist, the exposed photoresist is developed. After the photoresist is developed, the pattern is etched using the remaining photoresist as a mask, thereby removing unnecessary photoresist.

In the process of transferring a pattern using a mask, a mask having a necessary pattern thereon is needed. Accordingly, as the number of steps in which a mask is used increases, a manufacturing cost for preparing a mask increases. Also, since the above-described complicated steps are needed, a manufacturing process is complicated, a manufacturing time is extended, and a manufacturing cost rises.

SUMMARY OF THE INVENTION

To solve the above and/or other problems, the present invention provides an organic light emitting display device having a simplified manufacturing process and satisfying all of a patterning characteristic, an electrical characteristic, and a pad reliability of a pad unit, and a method of manufacturing the organic light emitting display device.

According to an aspect of the present invention, an organic light emitting display device includes a substrate, a thin film transistor formed on the substrate and including an active layer, a gate electrode including a gate lower electrode and a gate upper electrode, a source electrode, and a drain electrode, an organic light emitting device electrically connected to the thin film transistor, wherein the organic light emitting device includes a pixel electrode formed of the same material as at least a part of the gate electrode in the same layer, an intermediate layer including a light emitting layer, and an opposed electrode arranged to face the pixel electrode are sequentially deposited, and a first pad electrode formed of the same material as the gate upper electrode in the same layer, and a second pad electrode formed of the same material as the source electrode and the drain electrode in the same layer and including an ion doped layer in which predetermined ions are doped in a surface opposite to a surface facing the substrate.

The first pad electrode may include molybdenum (Mo).

The second pad electrode may include aluminum (Al).

The ions doped in the ion doped layer may include at least one of nickel (Ni) and lanthanum (La) ions.

The ions may be doped only in a surface and an adjacent area of the second pad electrode opposite to a surface facing the substrate.

The ion doped layer may be formed by an ion implantation process.

The ion doped layer may not be formed in the source electrode and the drain electrode.

The second pad electrode may be exposed to the outside.

The organic light emitting display device may further include a pad lower electrode formed of the same material as the gate lower electrode and the pixel electrode in the same layer and interposed between the substrate and the first pad electrode.

The gate lower electrode, the pixel electrode, and the pad lower electrode may include at least one of ITO, IZO, ZnO, and $In_2O_3$.

The organic light emitting display device may further include a storage capacitor that includes a capacitor lower electrode formed of the same material as the active layer in the same layer and a capacitor upper electrode formed of the same material as the gate lower electrode in the same layer.

The organic light emitting display device may be of a bottom emission type in which an image is presented toward the substrate.

According to another aspect of the present invention, an organic light emitting display device includes a first insulation layer formed on a substrate, an active layer formed on the first insulation layer, a second insulation layer covering the active layer, a pixel electrode formed on the second insulation layer, a gate lower electrode formed of the same material as the pixel electrode in the same layer above the active layer by being separated a predetermined distance from the pixel electrode, and a pad lower electrode formed of the same material as the gate lower electrode in the same layer by being separated a predetermined distance from the gate lower electrode, a gate upper electrode formed on the gate lower electrode, and a first pad electrode formed of the same material as the gate upper electrode in the same layer on the pad lower electrode, a third insulation layer covering at least a part of the pixel electrode, the gate upper electrode, and the first pad electrode, and source and drain electrodes formed on the third insulation layer by contacting the pixel electrode, and a second pad electrode formed of the same material as the source and drain electrodes in the same layer on the first pad electrode, wherein an ion doped layer in which predetermined ions are doped is formed in an upper portion of the second pad electrode.

The first pad electrode may include molybdenum (Mo), the second pad electrode may include aluminum (Al), and the ions doped in the ion doped layer may include at least one of nickel (Ni) and lanthanum (La) ions.

The ions may be doped only in a surface and an adjacent area of the second pad electrode opposite to a surface facing the substrate.

According to another aspect of the present invention, a method of manufacturing an organic light emitting display device includes forming an active layer on a substrate via a first mask process operation, forming a gate electrode and a first pad electrode via a second mask process operation, and an electrode pattern that forms a pixel electrode, above the active layer, forming an interlayer insulation layer having an opening that exposes both sides of the active layer via a third mask process operation, a part of the first pad electrode, and a part of the electrode pattern, forming source and drain electrodes contacting both exposed sides of the active layer via a fourth mask process operation, a second pad electrode contacting an exposed part of the first pad electrode, and the pixel electrode, forming a pixel define layer that exposes at least a part of the pixel electrode and at least a part of the second pad electrode via a fifth mask process operation, and doping predetermined ions in at least a part of the exposed second pad electrode.

The doping of predetermined ions in at least a part of the exposed second pad electrode may be performed by an ion implantation process.

The ion implantation process may be performed by applying an acceleration voltage of about 10-40 keV.

In the doping of predetermined ions in at least a part of the exposed second pad electrode, the ions may be doped only in a surface and an adjacent area of the second pad electrode opposite to a surface facing the substrate.

The doping of predetermined ions in at least a part of the exposed second pad electrode may be performed in a state in which the source and drain electrodes are covered by the pixel define layer.

The first pad electrode may include molybdenum (Mo), the second pad electrode may include aluminum (Al), and the ions doped in the ion doped layer may include at least one of nickel (Ni) and lanthanum (La) ions.

An annealing process operation of diffusing the injected ions may be performed after the doping of predetermined ions in at least a part of the exposed second pad electrode The second mask process operation may include sequentially depositing a second insulation layer, a first conductive layer, and a second conductive layer above the active layer, and forming the gate electrode including the first conductive layer as a gate lower electrode and the second conductive layer as a gate upper electrode and simultaneously forming the first conductive layer as a pad lower electrode and the second conductive layer as a first pad electrode, by patterning the first conductive layer and the second conductive layer.

The third mask process operation may include depositing a third insulation layer on the gate electrode, the first pad electrode, and the electrode pattern, and forming an opening by patterning the third insulation layer, the opening exposing parts of source and drain regions of the active layer, a part of the first pad electrode, and a part of the electrode pattern.

The fourth mask process operation may include depositing a third conductive layer on the interlayer insulation layer, and forming the source and drain electrodes and the second pad electrode by patterning the third conductive layer.

The fourth mask process operation may further include forming the source and drain electrodes and the second pad electrode, and forming the pixel electrode including the first conductive layer as an electrode by removing the second conductive layer constituting the electrode pattern.

The fifth mask process operation may include depositing a fourth insulation layer on an entire surface of the substrate, and forming the pixel define layer by patterning the fourth insulation layer.

BRIEF DESCRIPTION OF THE DRAWINGS

A more complete appreciation of the invention, and many of the attendant advantages thereof, will be readily apparent as the same becomes better understood by reference to the following detailed description when considered in conjunction with the accompanying drawings in which like reference symbols indicate the same or similar components, wherein:

FIGS. 3-12 are cross-sectional views for schematically illustrating a process of manufacturing the organic light emitting display device of FIG. 2;

DETAILED DESCRIPTION OF THE INVENTION

Figure 1:
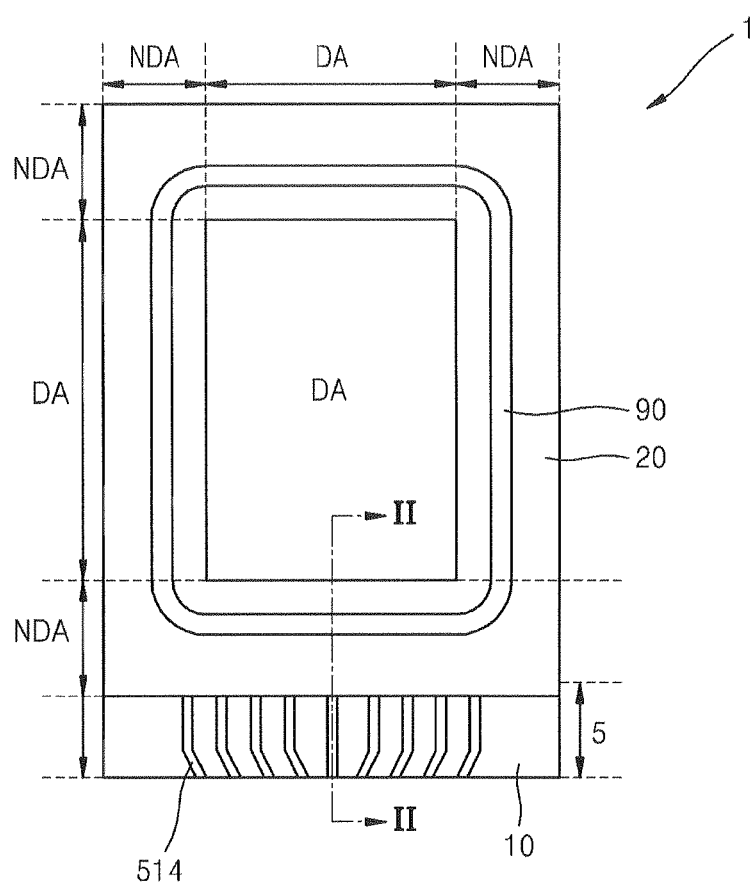
FIG. 1 is a plan view schematically illustrating the structure of an organic light emitting display device according to an embodiment of the present invention.

The attached drawings for illustrating exemplary embodiments of the present invention are referred to in order to gain a sufficient understanding of the present invention, the merits thereof, and the objectives accomplished by the implementation of the present invention. Hereinafter, the present invention will be described in detail by explaining exemplary embodiments of the invention with reference to the attached drawings Like reference numerals in the drawings denote like elements.

FIG. 1 is a plan view schematically illustrating the structure of an organic light emitting display device 1 according to an embodiment of the present invention. Referring to FIG. 1, the organic light emitting display device 1 according to the present embodiment includes a first substrate 10 including a thin film transistor (TFT) and a light emitting pixel, and a second substrate 20 that is coupled to the first substrate 10 via sealing.

The TFT, an organic electroluminescent device EL, and a storage capacitor Cst may be formed on the first substrate 10. Also, the first substrate 10 may be a low temperature poly silicon (LTPS) substrate, a glass substrate, a plastic substrate, or a stainless using steel (SUS) substrate.

The second substrate 20 may be an encapsulation substrate that is arranged on top of the first substrate 10 to shield the TFTs and the light emitting pixels provided on the first substrate 10 from external moisture or air. The second substrate 20 is disposed to face the first substrate 10, and the first and second substrates 10 and 20 are combined with each other via a sealing member 90 that is arranged along the edge thereof. The second substrate 20 may be a transparent glass or plastic substrate.

The first substrate 10 includes a light emitting area DA from which light is emitted and a non-light emitting area NDA that is disposed outside the light emitting area DA. According to the embodiments of the present invention, as the sealing member 90 is arranged in the non-light emitting area NDA outside the light emitting area DA, the first and second substrates 10 and 20 are combined together.

As described above, the EL, the TFT that drives the EL, and a wiring electrically connected to the components are formed in the light emitting area DA. The non-light emitting area NDA may include a pad area 5 where a pad electrode extending from the wiring of the light emitting area DA is disposed.

In the organic light emitting display device according to the present embodiment, the pad area 5 includes a first pad electrode and a second pad electrode, and an ion doped layer is provided in an upper portion of the second pad electrode. The structure of the pad electrode having the above structure will be described below in detail.

Figure 2:
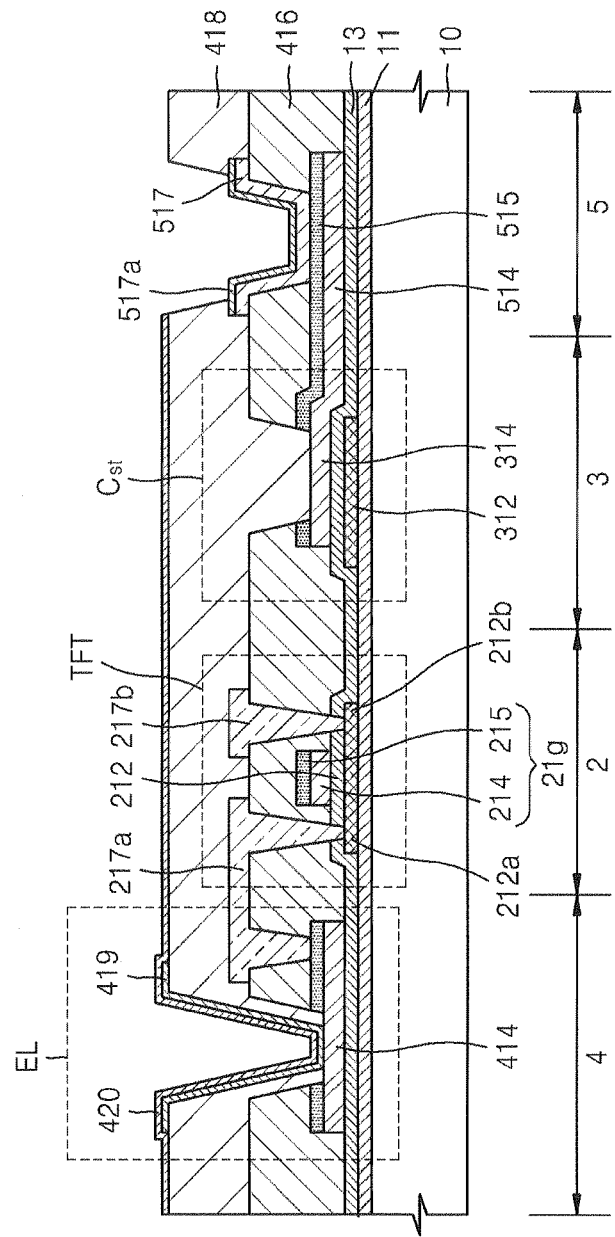
FIG. 2 is a cross-sectional view taken along a line II-II of FIG. 1.

FIG. 2 is a cross-sectional view taken along a line II-II of FIG. 1. Referring to FIG. 2, the organic light emitting display device 1 according to the present embodiment includes a channel area 2, a storage area 3, a light emitting area 4, and a pad area 5.

A TFT is provided as a driving device in the channel area 2. The TFT includes an active layer 212, a gate electrode 21g, and source and drain electrodes 217a and 217b. The gate electrode 21g includes a gate lower electrode 214 and a gate upper electrode 215. The gate lower electrode 214 may be formed of a transparent conductive material. A second insulation layer 13 for insulation between the gate electrode 21g and the active layer 212 is provided therebetween. Source and drain regions 212a and 212b in which high concentration impurities are injected are formed at both sides of the active layer 212 and are respectively connected to the source and drain electrodes 217a and 217b.

The storage capacitor Cst is provided in the storage area 3. The storage capacitor Cst includes a capacitor lower electrode 312 and a capacitor upper electrode 314. The second insulation layer 13 is interposed between the capacitor lower electrode 312 and the capacitor upper electrode 314. The capacitor lower electrode 312 may be formed of the same material as the active layer 212 of the TFT in the same layer. The capacitor upper electrode 314 may be formed of the same material as the gate lower electrode 214 of the TFT, a pixel electrode 414 of the EL, and a pad lower electrode 514, in the same layer.

The EL is provided in the light emitting area 4. The EL includes the pixel electrode 414 connected to one of the source and drain electrodes 217a and 217b of the TFT, an opposed electrode 420 formed to face the pixel electrode 414, and an intermediate layer 419 interposed between the pixel electrode 414 and the opposed electrode 420. The pixel electrode 414 may be formed of a transparent conductive material, and may be formed of the same material as the gate lower electrode 214 of the TFT in the same layer.

The pad area 5 includes the pad lower electrode 514, a first pad electrode 515, and a second pad electrode 517. The pad lower electrode 514 may be formed of the same material as the gate lower electrode 214 of the TFT, the capacitor upper electrode 314, and the pixel electrode 414 of the EL, in the same layer. Also, the first pad electrode 515 may be formed of the same material as the gate upper electrode 215 in the same layer. Also, the second pad electrode 517 may be formed of the same material as the source and drain electrodes 217a and 217b in the same layer. Hereinafter, the first pad electrode 515 and the second pad electrode 517 together are referred to as a pad electrode.

The organic light emitting display device according to the present embodiment includes the first pad electrode 515 and the second pad electrode 517 and an ion doped layer 517a is formed on an upper portion of the second pad electrode 517. That is, in the organic light emitting display device according to the present embodiment, the second pad electrode 517 is formed of the same material as the source drain electrodes 217a and 217b in the same layer, and the ion doped layer 517a is formed on a surface of the second pad electrode 517, thereby satisfying all of a patterning characteristic, an electric characteristic, and a pad reliability. That is, the ion doping layer 517a that has a low resistance and simultaneously capable of functioning as a capping layer is formed by doping ions such as nickel (Ni) or lanthanum (La) ions in the upper portion of the second pad electrode 517 formed of a material such as aluminum. A method of forming the ion doping layer 517a and an effect thereof will be described in detail with reference to FIG. 12. Although FIG. 2 illustrates that the second pad electrode 517 and the ion doped layer 517a are layers separated from each other, it can be said that the ion doped layer 517a is included in the second pad electrode 517 because the ion doped layer 517a is a layer that is obtained as a part of the second pad electrode 517 is changed by doping ions such as nickel (Ni) or lanthanum (La) into the second pad electrode 517.

A process of manufacturing the organic light emitting display device of a rear surface emission type shown in FIG. 2 will be described below. FIGS. 3-12 are cross-sectional views schematically illustrating a process of the organic light emitting display device of a rear surface emission type shown in FIG. 2.

Figure 3:
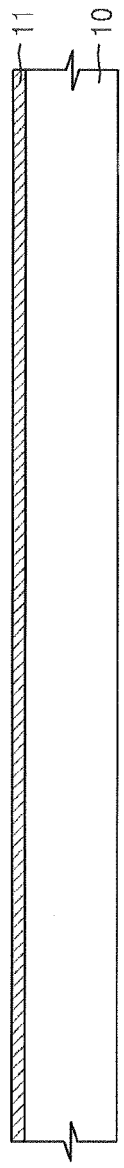

First, as illustrated in FIG. 3, a first insulation layer 11 is formed on a substrate 10. In detail, the substrate 10 may be formed of a transparent glass material having a main component of $SiO_2$. The substrate 10 is not limited thereto and a variety of substrates formed of various materials such as a transparent plastic material or a metal member may be used.

The first insulation layer 11 such as a barrier layer and/or a buffer layer for preventing diffusion of impurity ions, preventing intrusion of moisture or external air, and planarizing a surface of the substrate 10 may be provided on an upper surface of the substrate 10. The first insulation layer 11 may be deposited using $SiO_2$ and/or $SiN_x$ by a various deposition methods such as a plasma enhanced chemical vapor deposition (PECVD) method, an atmospheric pressure CVD (APCVD) method, or a lower pressure CVD (LPCVD) method.

Figure 4:
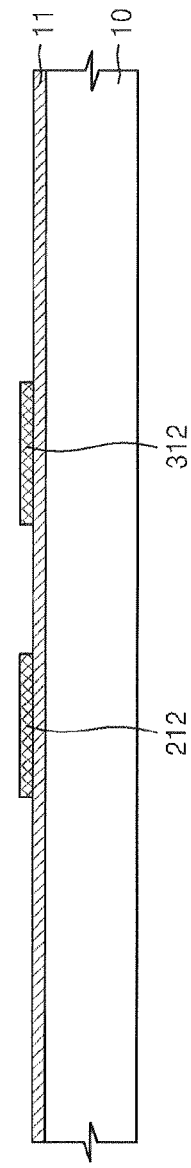

Next, as illustrated in FIG. 4, the active layer 212 of the TFT and the capacitor lower electrode 312 of the storage capacitor Cst are formed on an upper surface of the first insulation layer 11. In detail, amorphous silicon is first deposited on the upper surface of the first insulation layer 11, and then the amorphous silicon is crystallized to form a polycrystal silicon layer (not shown). The amorphous silicon may be crystallized by a variety of methods such as a rapid thermal annealing (RTA) method, a solid phase crystallization (SPC) method, an excimer laser annealing (ELA) method, a metal induced crystallization (MIC) method, a metal induced lateral crystallization (MILC) method, or a sequential lateral solidification (SLS) method. The polycrystal silicon layer is patterned into the active layer 212 of the TFT and the capacitor lower electrode 312 of the storage capacitor Cst via a mask process using a first mask (not shown).

Figure 5:
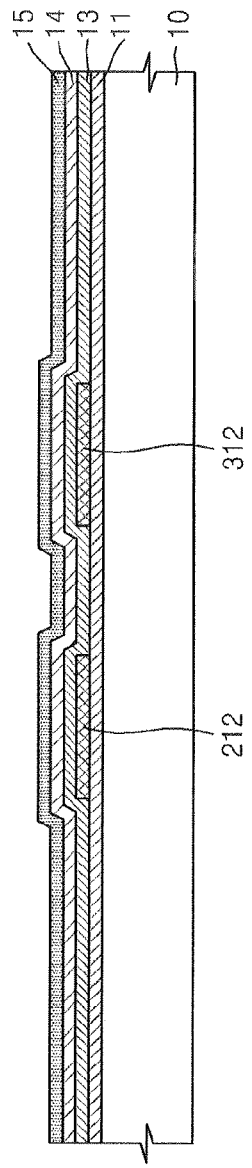

In the present embodiment, the active layer 212 and the capacitor lower electrode 312 are separated from each other, but the active layer 212 and the capacitor lower electrode 312 may be formed in one body. Next, as illustrated in FIG. 5, the second insulation layer 13, a first conductive layer 14, and a second conductive layer 15 are sequentially deposited on the entire surface of the substrate 10 where the active layer 212 and the capacitor lower electrode 312 are formed.

The second insulation layer 13 may be formed by depositing an inorganic insulation layer such as $SiN_x$ or $SiO_x$ in a method such as a PECVD method, an APCVD method, or an LPCVD method. The second insulation layer 13 is interposed between the active layer 212 of the TFT and the gate electrode (refer to 21g of FIG. 2) and functions as a gate insulation layer of the TFT, and also interposed between the capacitor upper electrode (refer to 314 of FIG. 2) and the capacitor lower electrode 312 and functions as a dielectric layer of the storage capacitor Cst.

The first conductive layer 14 may include one or more materials selected from a group consisting of transparent materials including ITO, IZO, ZnO, or $In_2O_3$. The first conductive layer 14 may be patterned later into the pixel electrode 414, the gate lower electrode 214, the capacitor upper electrode 314, and the pad lower electrode 514.

The second conductive layer 15 may include one or more materials selected from a group consisting of Ag, Mg, Al, Pt, Pd, Au, Ni, Nd, Ir, Cr, Li, Ca, Mo, Ti, W, MoW, and Al/Cu. The second conductive layer 15 may be patterned later into the gate upper electrode 215 and the first pad electrode 515. The second conductive layer 15 may be molybdenum (Mo).

Next, as illustrated in FIG. 6, the gate electrode 21g, electrode patterns 30 and 40, the pad lower electrode 514, and the first pad electrode 515 are formed on the substrate 10. In detail, the first conductive layer 14 and the second conductive layer 15, which are sequentially deposited on the entire surface of the substrate 10, are patterned by a mask process using a second mask (not shown).

The gate electrode 21g is formed on an upper surface of the active layer 212 in the channel area 2. The gate electrode 21g includes the gate lower electrode 214 constituting as a part of the first conductive layer 14 and the gate upper electrode 215 constituting as a part of the second conductive layer 15. The gate electrode 21g is formed corresponding to the center of the active layer 212. The source and drain regions 212a and 212b are formed at both edges of the active layer 212 corresponding to both sides of the gate electrode 21g by doping n-type or p-type impurities in the active layer 212 using the gate electrode 21g as a mask, and the channel area 2 is formed between the source and drain regions 212a and 212b.

The electrode pattern 30 for forming the capacitor upper electrode (314 shown in FIG. 2) later is formed on an upper surface of the capacitor lower electrode 312 in the storage area 3. The electrode pattern 40 for forming the pixel electrode (414 shown in FIG. 2) later is formed in the light emitting area 4.

The pad lower electrode 514 formed as a part of the first conductive layer 14 and the first pad electrode 515 formed as a part of the second conductive layer 15 are formed in the pad area 5. Although in the drawings the electrode pattern 30 formed in the storage area 3 and the pad lower electrode 514 and the first pad electrode 515 formed in the pad area 5 are illustrated to be formed in one body, the present invention is not limited thereto and thus the electrode pattern 30 formed in the storage area 3 and the pad lower electrode 514 and the first pad electrode 515 formed in the pad area 5 may be separately formed.

Next, as illustrated in FIG. 7, a third insulation layer 16 is deposited on the entire surface of the substrate 10 where the gate electrode 21g is formed. The third insulation layer 16 is formed of one or more organic insulation materials selected from a group consisting of polyimide, polyamide, acryl resin, benzocyclobutene, and phenol resin, in a method such as spin coating. The third insulation layer 16 is formed to a sufficient thickness, for example, to be thicker than the second insulation layer 13, and functions as an interlayer insulation layer (416 shown in FIGS. 2 and 8) between the gate electrode 21g and the source and drain electrodes (217a and 217b shown in FIG. 2) of the TFT. The third insulation layer 16 may be formed of not only the above-described organic insulation material but also an inorganic insulation material such as the second insulation layer 13, or formed by alternately arranging an organic insulation material and an inorganic insulation material.

Next, as illustrated in FIG. 8, the interlayer insulation layer 416 having openings H1, H2, H3, H4, H5, and H6 for exposing parts of the electrode patterns 30 and 40 and the source and drain regions 212a and 212b is formed by patterning the third insulation layer 16. In detail, the third insulation layer 16 is patterned by a mask process using a third mask (not shown), thereby forming the openings H1, H2, H3, H4, H5, and H6. The openings H1 and H2 expose parts of the source and drain regions 212a and 212b. The openings H3 and H4 expose a part of the second conductive layer 15 constituting the upper portion of the electrode pattern 40. The opening H5 exposes a part of the second conductive layer 15 constituting the upper portion of the electrode pattern 30. The opening H6 exposes a part of the first pad electrode 515.

Next, as illustrated in FIG. 9, a third conductive layer 17 is deposited on the entire surface of the substrate 10 to cover the interlayer insulation layer 16. The third conductive layer 17 may be formed of the same conductive material as the above-described first or second conductive layer 14 or 15. However, the present invention is not limited thereto and the third conductive layer 17 may be formed of one selected from a variety of conductive materials. The third conductive layer 17 may include aluminum Al having a low resistance characteristic. The conductive material is deposited to a sufficient thickness to fill at least a part of the above-described openings H1, H2, H3, H4, H5, and H6.

Figure 10:
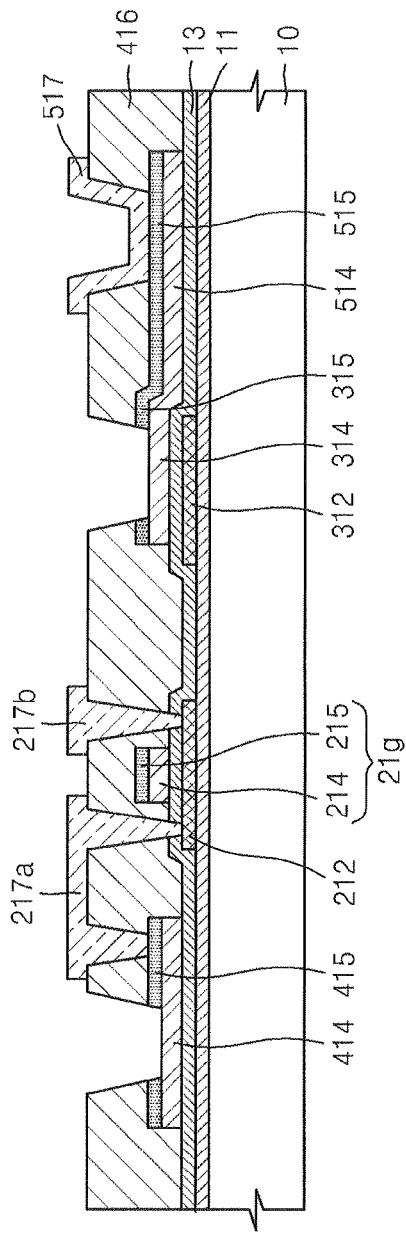

Next, as illustrated in FIG. 10, the source and drain electrodes 217a and 217b, the capacitor upper electrode 314 of the pixel electrode 414, and the second pad electrode 517 are formed by patterning the third conductive layer 17 (FIG. 9). In detail, the source and drain electrodes 217a and 217b and the second pad electrode 517 are formed by patterning the third conductive layer 17 (FIG. 9) in a mask process using a fourth mask (not shown). One of the source and drain electrodes 217a and 217b, that is, the source electrode 217a in the present embodiment, is formed to connect the pixel electrode 414 via the opening H3 (FIG. 8) at the edge area of a second conductive layer 415 of the electrode pattern 40 (FIG. 9) where the pixel electrode 414 is to be formed.

After the source and drain electrodes 217a and 217b are formed, the pixel electrode 414 and the capacitor upper electrode 314 are formed by additional etching. In detail, the pixel electrode 414 is formed by removing the second conductive layer 415, which is exposed by the opening H4, of the electrode pattern 40 (FIG. 9). The capacitor upper electrode 314 is formed by removing the second conductive layer 315, which is exposed by the opening H5, of the electrode pattern 30 (FIG. 9).

Thus, the gate lower electrode 214, the capacitor upper electrode 314, the pixel electrode 414, and the pad lower electrode 514 are formed of the same material and in the same layer. The capacitor lower electrode 312 may be doped by injecting n-type or p-type impurities through the opening H5

(FIG. 8). The impurities injected during doping may be the same as or different from one used during the doping of the active layer 212.

Figure 11:
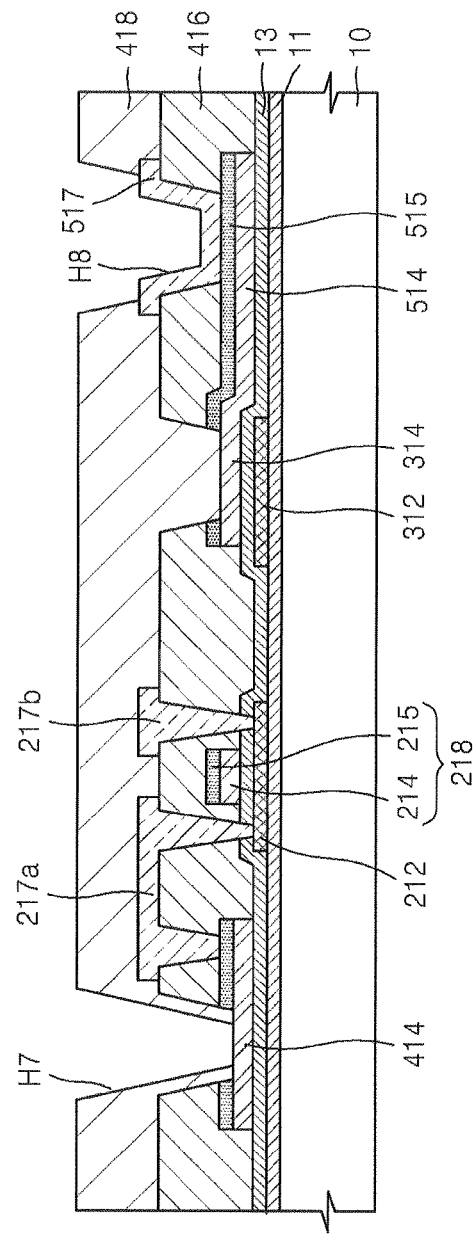

Next, as illustrated in FIG. 11, a pixel define layer (PDL) 418 is formed on the substrate 10. In detail, a fourth insulation layer (not shown) is deposited on the entire surface of the substrate 10 where the pixel electrode 414, the source and drain electrodes 217a and 217b, the capacitor upper electrode 314, and the second pad electrode 517 are formed. The fourth insulation layer may be formed of one or more organic insulation materials selected from a group consisting of polyimide, polyamide, acryl resin, benzocyclobutene, and phenol resin, in a method such as spin coating. Also, the fourth insulation layer may be formed of an inorganic insulation material selected from a group consisting of $SiO_2$, $SiN_x$, $Al_2O_3$, $CuO_x$, $Tb_4O_7$, $Y_2O_3$, $Nb_2O_5$, and $Pr_2O_3$, in addition to the above organic insulation material. The fourth insulation layer may be formed in a multilayer structure in which the organic insulation material and the inorganic insulation material are alternately arranged.

The PDL 418 for defining a pixel is formed by patterning the fourth insulation layer in a mask process using a fifth mask (not shown) to form an opening H7 that exposes the center portion of the pixel electrode 414 and an opening H8 that exposes the center portion of the second pad electrode 517.

Figure 12:
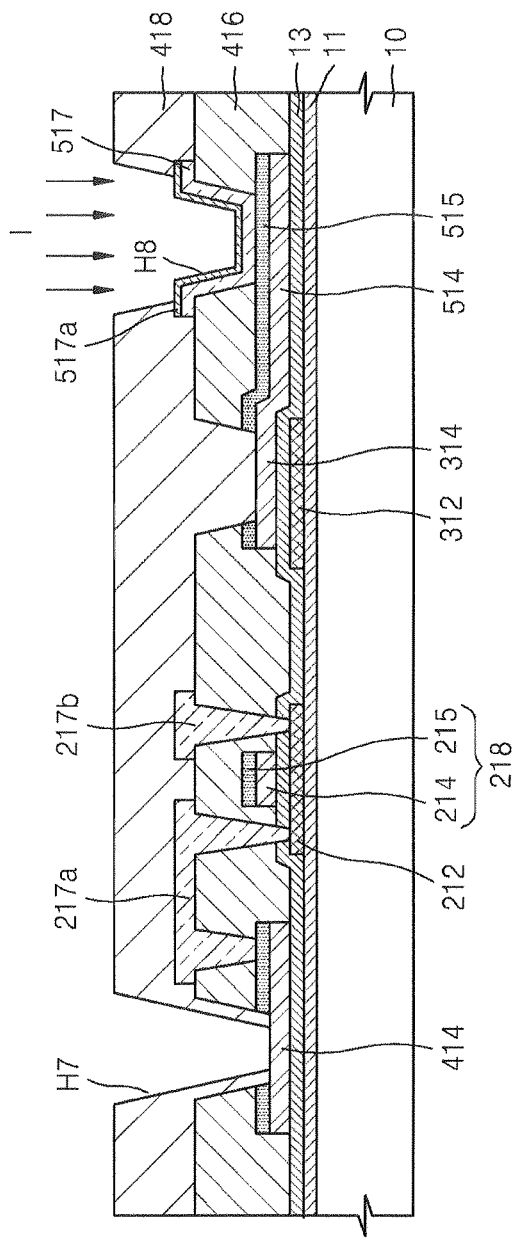

Next, as illustrated in FIG. 12, the ion doping layer 517a is formed by doping ions such as nickel (Ni) or lanthanum (La) ions in the upper portion of the second pad electrode 517 exposed by the opening H8. In detail, the organic light emitting display device according to the present embodiment includes the first pad electrode 515 and the second pad electrode 517, in which the ion doped layer 517a is characteristically formed on the upper surface of the second pad electrode 517 and will be described below in detail.

The requirements of a pad electrode may include a patterning characteristic, an electric characteristic, and pad reliability. Although there is a demand to develop a pad electrode that satisfies all three requirements, no pad electrode satisfies all the requirements until now. For example, when a pad electrode is configured in a tri-layer structure of molybdenum (Mo)-aluminum (Al)-molybdenum (Mo), while a patterning characteristic with respect to wet etch is superior, Mo may be oxidized and a galvanic reaction occurs between Mo and Al so that the pad reliability requirement may not be satisfied. When a pad electrode is configured in a tri-layer structure of titanium (Ti)-aluminum (Al)-titanium (Ti), while there is no worry of oxidization and corrosion and a pad reliability is superior, it is a problem that wet etch may not be employed. Also, when a pad electrode is formed in a dual structure of Mo and Al only, an $Al_2O_3$ oxide is generated on a surface and thus Al is corrodes. That is, it is impossible to configure a pad electrode with the same material as one for forming a source/drain electrode. To address this problem, a method of forming a pad electrode with the same material as a pixel electrode in the same layer has been considered, but it is a problem that a transparent electrode such as ITO forming a pixel electrode has too high resistance and a low structural reliability.

To address the above problems, in the organic light emitting display device according to the present embodiment, while the second pad electrode 517 is formed of the same material as the source and drain electrodes 217a and 217b in the same layer, the ion doped layer 517a is formed on the surface of the second pad electrode 517 so that the patterning characteristic, the electrical characteristic, and the pad reliability are all satisfied. That is, as ions such as nickel (Ni) or lanthanum (La) ions are doped in the upper portion of the second pad electrode 517 that is formed of a material such as aluminum (Al), the ion doped layer 517a which is a low resistance and simultaneously capable of functioning as a capping layer may be formed.

The ion doped layer 517a may be formed by, for example, an ion implantation process. That is, the ion doped layer 517a is formed by injecting ions such as nickel (Ni) or lanthanum (La) ions in the upper portion of the second pad electrode 517 that is formed of a material such as aluminum (Al), as illustrated in FIG. 12. The acceleration voltage of ions I being injected may be controlled such that the ions I may be doped only in the surface and the upper portion of the second pad electrode 517, not in the entire portion of the second pad electrode 517. For example, by controlling the acceleration voltage of the ion implantation process at a level of about 10-40 keV, the ions I may be doped only in the surface and the upper portion of the second pad electrode 517.

As such, since the ion doped layer 517a prevents the second pad electrode 517 formed of a material such as aluminum (Al) from being oxidized and corroded, the pad reliability may be improved.

It is preferred to perform ion doping only in the upper portion of the second pad electrode 517, not in the source and drain electrodes 217a and 217b. This is because, when ions are doped into pure aluminum, resistance may slightly increase. However, since the resistance of a wiring should be low at its maximum in the source and drain electrodes 217a and 217b, a slight increase in resistance may be problematic. In contrast, the pad area is not much sensitive to the slight resistance increase and may have a characteristic of being strong to corrosion because the second pad electrode 517 is exposed to the outside. Thus, while the resistance of the source and drain electrodes 217a and 217b needs to be maintained as low as possible by preventing the ion doping into the source and drain electrodes 217a and 217b that are sensitive to the resistance increase, the second pad electrode 517 has a high anti-corrosion characteristic by performing ion doping into the second pad electrode 517 that is sensitive to oxidization and corrosion.

As illustrated in FIG. 12, since the ion injection process is performed after the PDL 418 is formed, even when ions are doped in the entire surface of the organic light emitting display device, the ions are not doped in the source and drain electrodes 217a and 217b that is protected by the PDL 418, but only in the second pad electrode 517 that is exposed to the outside, so that the ion doping layer 517a where ions are doped may be formed.

Figure 13:
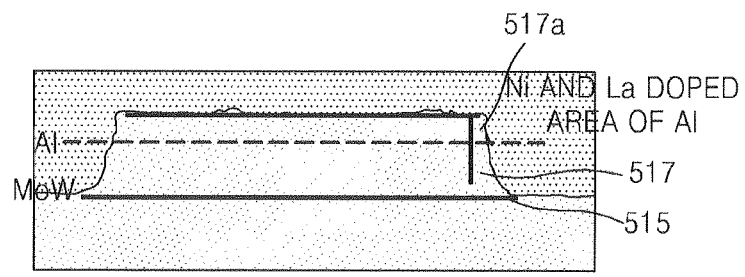
FIG. 13 schematically illustrates the shape of a pad electrode of an organic light emitting display device manufactured by a manufacturing method of the present invention.
Figure 14:
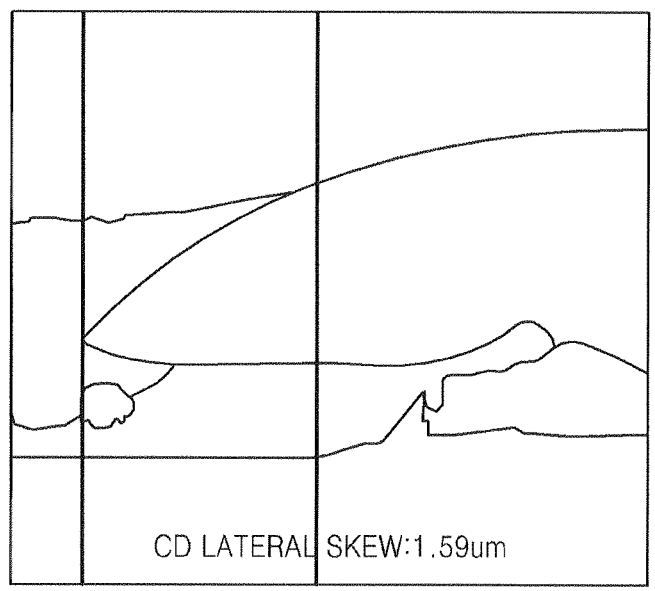
FIG. 14 schematically illustrates the shape of a pad electrode of a conventional organic light emitting display device, in which the pad electrode is formed in a tri-layer structure of molybdenum (Mo)-aluminum (Al)-molybdenum (Mo)

FIG. 13 schematically illustrates the shape of a pad electrode of an organic light emitting display device manufactured by a manufacturing method of the present invention. FIG. 14 schematically illustrates the shape of a pad electrode of a conventional organic light emitting display device, in which the pad electrode is formed in a tri-layer structure of molybdenum (Mo)-aluminum (Al)-molybdenum (Mo).

Referring to FIG. 13, in the organic light emitting display device manufactured by a manufacturing method of the present invention, after the source and drain electrodes 217a and 217b and the second pad electrode 517 are all etched, it can be seen that a CD lateral skew is about 1.2 μm and a taper angle after etching is an ideal angle of 72°.

In contrast, referring to FIG. 14, when a pad electrode is configured in a tri-layer structure of molybdenum (Mo)-aluminum (Al)-molybdenum (Mo), after the source and drain electrodes and the pad electrode are all etched, it can be seen that a CD lateral skew is about 1.59 μm and a taper angle after etching is 45° or less that is too much inclined. As such, when the taper angle too low, actually applied resistance may increase.

When a pad electrode is configured by the first pad electrode 515 formed of molybdenum (Mo), the second pad electrode 517 formed of aluminum (Al), and the ion doped layer 517a that is doped with nickel (Ni) or lanthanum (La) ions and disposed on the second pad electrode 517, since resistivity of Al and AlNiLa is about 1/100 to ITO, resistance may be reduced to 1/1000 compared to a pad wiring in which a pad electrode is formed of ITO.

Also, comparing the present invention with the molybdenum (Mo)-aluminum (Al)-molybdenum (Mo) structure in terms of a wiring, it can be seen that the patterning characteristic of the present invention is improved, that is, the CD lateral skew is improved to about 1.2 μm. Also, since the taper angle approaches an ideal value after etching and the top portion of the pad is formed of AlNiLa, not Mo, it can be seen that the pad electrodes of the present invention may have a high anti-corrosion characteristic.

Also, when the pad electrodes of the present invention and the ITO structure are compared, while the thickness of the pad electrode of the present invention is about 500 nm, the thickness of the ITO pad structure is merely about 30 nm so that it can be seen that the structural stability of the present invention is much higher. Therefore, according to the present invention, the patterning characteristic, the electric characteristic, and the pad reliability of the pad portion are all satisfied.

Meanwhile, after the ion implantation process is performed as illustrated in FIG. 12, an annealing process is additionally performed to diffuse the injected ions so that a concentration profile according to a depth may become uniform.

Figure 15:
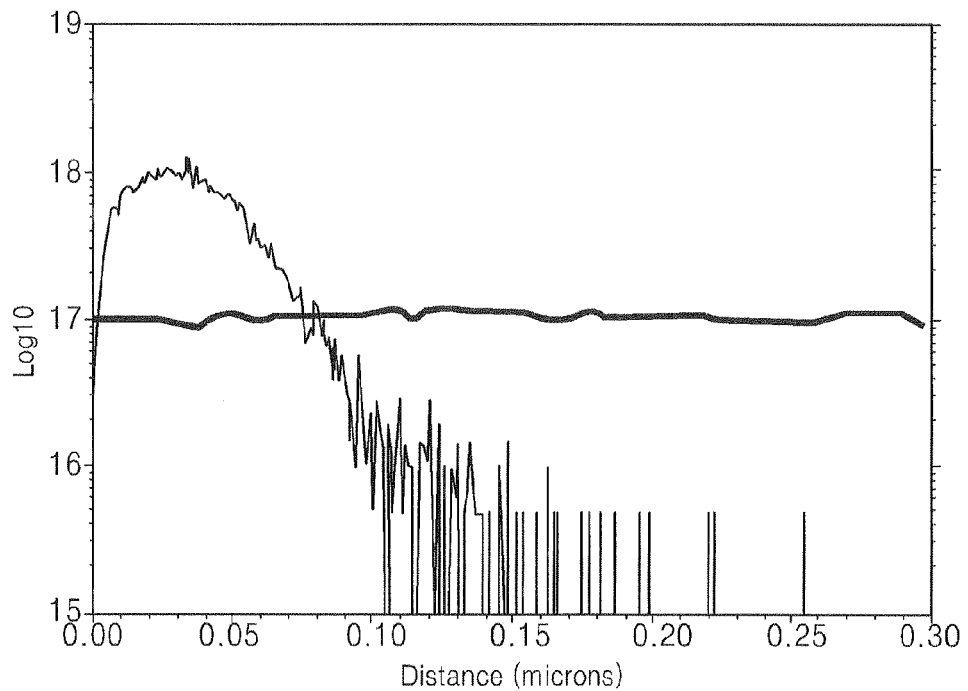
FIG. 15 is a graph showing a concentration profile according to a depth after an ion implantation process.
Figure 16:
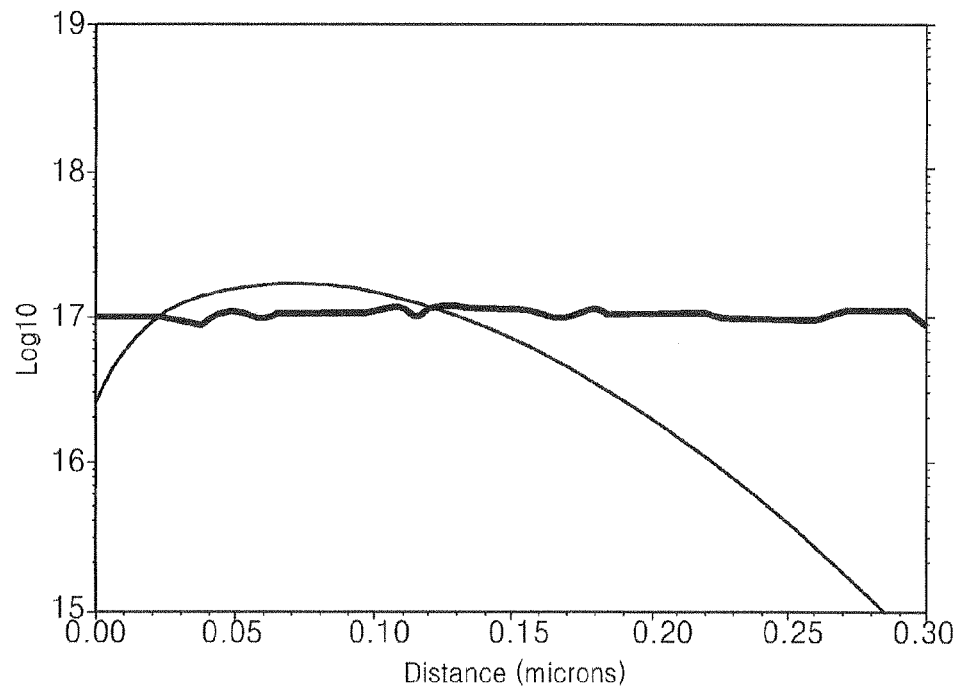
FIG. 16 is a graph showing a concentration profile according to a depth after an annealing process is performed.

FIG. 15 is a graph showing a concentration profile as a function of a depth after an ion implantation process. FIG. 16 is a graph showing a concentration profile as a function of a depth after an annealing process is performed. As illustrated in FIGS. 15 and 16, rather than performing the ion implantation process only, when an annealing process is additionally performed, it can be seen that the concentration distribution of ions is uniform and smooth.

As illustrated in FIG. 2, the intermediate layer 419 including an organic light emitting layer and the opposed electrode 420 are formed in the opening H7 (FIG. 12) that exposes the pixel electrode 414. The intermediate layer 419 may be formed by depositing an emissive layer EML, and at least one of other function layers such as a hole transport layer HTL, a hole injection layer HIL, an electron transport layer ETL, and an electron injection layer EIL, in a single or combined structure.

The intermediate layer 419 may be formed of a low molecule organic material or a polymer organic material. When the intermediate layer 419 is formed of a low molecule organic material, the HTL and the HIL are deposited in a direction toward the pixel electrode 414 with respect to the organic light emitting layer and the ETL and the EIL are deposited in a direction toward the opposed electrode 420 with respect to the organic light emitting layer. Also, a variety of layers may be deposited as necessary. A usable organic material may include copper phthalocyanine (CuPc), N,N'-Di(naphthalene-1-yl)-N,N'-diphenyl-benzidine (NPB), or tris-8-hydroxyquinoline aluminum (Alq3).

When the intermediate layer 419 is formed of a polymer organic material, the HTL only may be included in a direction to the pixel electrode 414 with respect to the organic light emitting layer. The HTL may be formed on the pixel electrode 414 in a method such as inkjet printing or spin coating using poly-(2,4)-ethylene-dihydroxy thiophene (PEDOT) or polyaniline (PANI). A usable organic material may include a polyphenylenevinylene (PPV) based or polyfluorene based polymer organic material.

The opposed electrode 420 may be formed as a common electrode by being deposited on the entire surface of the substrate 10. In the organic light emitting display device according to the present embodiment, the pixel electrode 414 is used as an anode electrode and the opposed electrode 420 is used as a cathode electrode. Also, the polarities of the electrodes may be reversely applied.

In a bottom emission type organic light emitting display device in which an image is presented in a direction toward the substrate 10, the pixel electrode 414 is a transparent electrode and the opposed electrode 420 is a reflection electrode. The reflection electrode may be formed by thinly depositing metal having a low work function, for example, Ag, Mg, Al, Pt, Pd, Au, Ni, Nd, Ir, Cr, Li, Ca, LiF/Ca, LiF/Al, or a compound thereof.

During each mask process for forming the above-described organic light emitting display device, a deposition layer may be removed by dry etching or wet etching. In the above-described embodiment, an organic light emitting display device is described as an example. However, the present invention is not limited thereto and a variety of display devices including a liquid crystal display device may be employed. Also, although one TFT and one capacitor are illustrated in the drawings that illustrate the embodiment according to the present invention, this is for convenience of explanation and the present invention is not limited thereto. A plurality of TFTs and a plurality of capacitors may be included without increasing the number of mask processes according to the present invention.

As described above, according to the organic light emitting display device according to the present invention, a manufacturing process is simplified, and all of a patterning characteristic, an electrical characteristic, and a pad reliability of a pad unit are satisfied.

While this invention has been particularly shown and described with reference to exemplary embodiments thereof, it will be understood by those skilled in the art that various changes in form and details may be made therein without departing from the spirit and scope of the invention as defined by the appended claims.

What is claimed is:

1. A method of manufacturing an organic light emitting display device, the method comprising:

forming an active layer on a substrate via a first mask process operation, the substrate having a light emitting area and a non-light emitting area that is disposed outside the light emitting area to surround the light emitting area, the active layer being formed in the light emitting area of the substrate;

forming a gate electrode and a first pad electrode via a second mask process operation, and an electrode pattern that forms a pixel electrode, above the active layer, the gate electrode and the electrode pattern being formed in the light emitting area of the substrate, the first pad electrode being formed in the non-light emitting area of the substrate;

forming an interlayer insulation layer having an opening that exposes both sides of the active layer, via a third mask process operation, a part of the first pad electrode, and a part of the electrode pattern;

forming source and drain electrodes contacting both exposed sides of the active layer via a fourth mask process operation, a second pad electrode contacting an exposed part of the first pad electrode, and the pixel electrode, the second pad electrode electrically connected to the first pad electrode, the source and drain electrodes being formed in the light emitting area of the substrate, the second pad electrode being formed in the non-light emitting area of the substrate;

forming a pixel define layer that exposes at least a part of the pixel electrode and at least a part of the second pad electrode via a fifth mask process operation; and doping predetermined ions in at least a part of the exposed second pad electrode.

2. The method of claim 1, wherein the doping of predetermined ions in at least a part of the exposed second pad electrode is performed by an ion implantation process.

3. The method of claim 1, wherein the ion implantation process is performed by applying an acceleration voltage of about 10-40 keV.

4. The method of claim 1, wherein, in the doping of predetermined ions in at least a part of the exposed second pad electrode, the ions are doped only in a surface and an adjacent area of the second pad electrode opposite to a surface facing the substrate.

5. The method of claim 1, wherein the doping of predetermined ions in at least a part of the exposed second pad electrode is performed in a state in which the source and drain electrodes are covered by the pixel define layer.

6. The method of claim 1, wherein the first pad electrode comprises molybdenum (Mo), the second pad electrode comprises aluminum (Al), and the ions doped in the ion doped layer comprise at least one of nickel (Ni) and lanthanum (La) ions.

7. The method of claim 1, wherein an annealing process operation of diffusing the injected ions is performed after the doping of predetermined ions in at least a part of the exposed second pad electrode.

8. The method of claim 1, wherein the second mask process operation comprises:

sequentially depositing a second insulation layer, a first conductive layer, and a second conductive layer above the active layer; and forming the gate electrode comprising the first conductive layer as a gate lower electrode and the second conductive layer as a gate upper electrode and simultaneously forming the first conductive layer as a pad lower electrode and the second conductive layer as a first pad electrode, by patterning the first conductive layer and the second conductive layer.

9. The method of claim 1, wherein the third mask process operation comprises:

depositing a third insulation layer on the gate electrode, the first pad electrode, and the electrode pattern; and forming an opening by patterning the third insulation layer, the opening exposing parts of source and drain regions of the active layer, a part of the first pad electrode, and a part of the electrode pattern.

10. The method of claim 1, wherein the fourth mask process operation comprises:

depositing a third conductive layer on the interlayer insulation layer; and forming the source and drain electrodes and the second pad electrode by patterning the third conductive layer.

11. The method of claim 1, wherein the fourth mask process operation further comprises:

forming the source and drain electrodes and the second pad electrode; and forming the pixel electrode comprising the first conductive layer as an electrode by removing the second conductive layer constituting the electrode pattern.

12. The method of claim 1, wherein the fifth mask process operation comprises:

depositing a fourth insulation layer on an entire surface of the substrate; and forming the pixel define layer by patterning the fourth insulation layer.

\* \* \* \* \*